United States Patent [19]

Stockton et al.

[11] 4,442,590

[45] Apr. 17, 1984

[54] MONOLITHIC MICROWAVE INTEGRATED CIRCUIT WITH INTEGRAL ARRAY ANTENNA

[75] Inventors: Ronald J. Stockton, Nederland; Robert E. Munson, Boulder, both of Colo.

[73] Assignee: Ball Corporation, Muncie, Ind.

[21] Appl. No.: 390,859

[22] Filed: Jun. 22, 1982

Related U.S. Application Data

[62] Division of Ser. No. 207,289, Nov. 17, 1980.

[51] Int. Cl.[3] .......... H01L 21/82

[52] U.S. Cl. .......... 29/571; 29/577 C; 29/578; 29/576 B

[58] Field of Search .......... 29/571, 576 B, 577 R, 29/577 C, 578; 357/41, 24

[56] References Cited

U.S. PATENT DOCUMENTS

| | | | |
|---|---|---|---|
| 3,504,430 | 4/1970 | Kubo | 29/571 |
| 3,783,044 | 1/1974 | Cheskis et al. | 148/175 |
| 3,824,677 | 7/1974 | Scherber | 29/571 |

*Primary Examiner*—G. Ozaki
*Assistant Examiner*—David A. Hey
*Attorney, Agent, or Firm*—Ball Corporation

[57] ABSTRACT

A monolithic microwave integrated circuit including an integral array antenna. The system includes radiating elements, feed network, phasing network, active and/or passive semiconductor devices, digital logic interface circuits and a microcomputer controller simultaneously incorporated on a single substrate by means of a controlled fabrication process sequence.

1 Claim, 13 Drawing Figures

F I G. 3
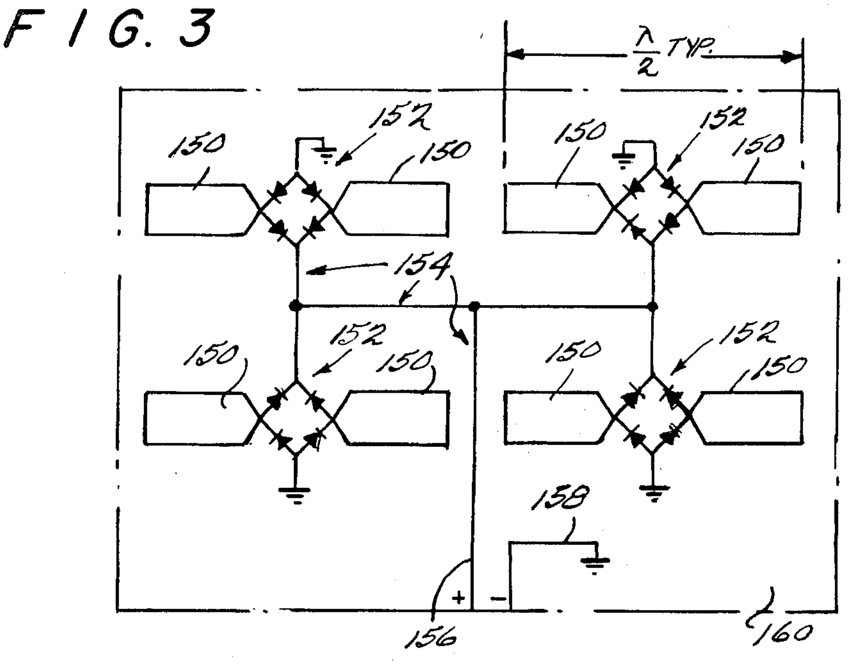
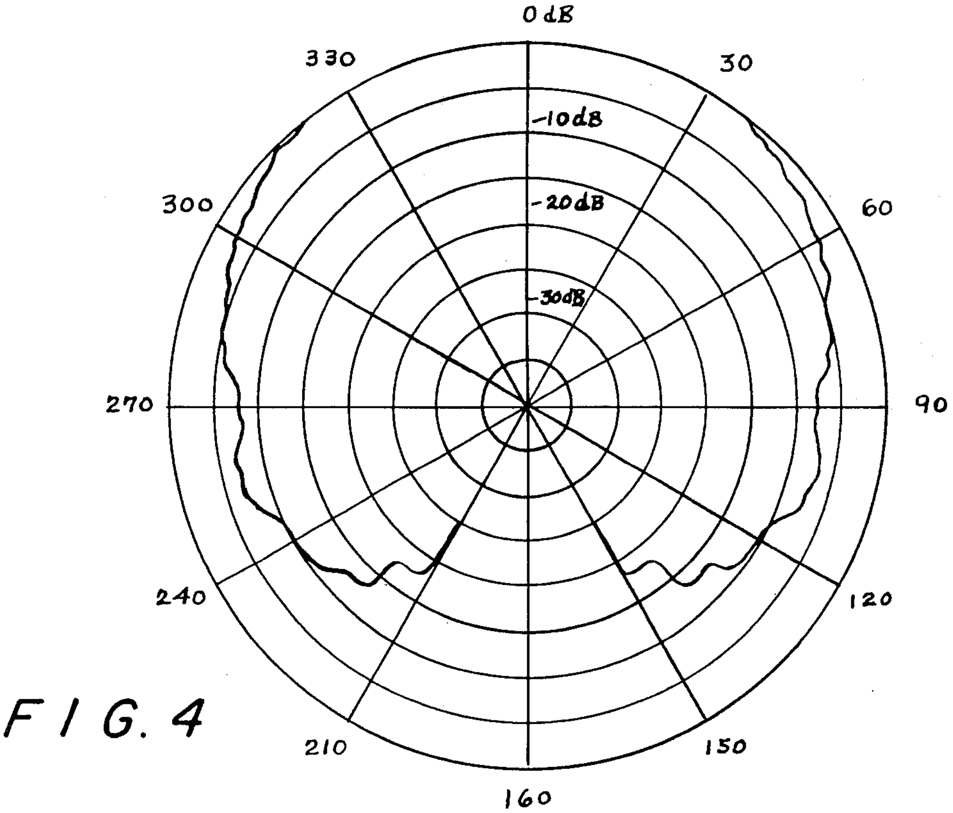
F I G. 4

RADIATED PATTERN
HPBW = 90°

RADIATED PATTERN
HPBW = 126°

MONOLITHIC MICROWAVE INTEGRATED CIRCUIT WITH INTEGRAL ARRAY ANTENNA

This is a division of application Ser. No. 207,289 filed Nov. 17, 1980.

BACKGROUND OF THE INVENTION

This invention relates generally to microwave circuits and to the fabrication thereof.

The state of the art in fabrication and construction of millimeter and sub-millimeter wave length microwave systems before the present invention was essentially a "bolt together" waveguide component technology. Individual circuits or discrete components were developed and then interconnected to provide the desired system. In essence, the "blocks" of the overall block diagram of the microwave system were assembled after each "block" was individually developed.

Various problems and shortcomings are inherent in the "bolt-together" approach. One such shortcoming is the high frequency limitation that exists when separate components are bolted together. The size and separation of individual components cannot be scaled proportionally for extremely short wave lengths, resulting in uncontrollable parasitic reactances which limit performance. Other difficulties inherent in the waveguide approach are bulkiness, excessive weight, and high manufacturing costs. In addition, minor design changes can result in costly hardware modifications.

The technology of electronic circuitry has evolved from discrete components such as diodes, transistors, capacitors, and resistors on printed circuit boards to the use of monolithic linear and digital integrated circuits. This trend has continued by combining specific integrated circuit functions into larger integrated circuits having versatile and multi-function capability such as in the case of electronic calculators, watches, and microcomputers.

Concurrently with these developments in electronic circuitry, similar techniques have been employed in the technology of microwave circuits. GaAs field effect transistors (FETs) have been developed as well as microwave integrated circuit components such as oscillators, mixers, amplifiers, detectors, and filters, using both monolithic and hybrid construction techniques. With the development of the micro-strip radiator, high performance monolithic micro-strip phased arrays have also been developed.

It has been recognized that there are advantages in performance and versatility to be gained by building micro-computer controlled antenna systems. Various multi-mode systems have been developed to demonstrate these advantages. In such systems, the electronics, comprising of integrated circuits mounted on printed circuit boards were packaged separately and interfaced with an antenna by means of a multi-conductor cable. Such construction represents the present state of the art in microwave system fabrication. To date, complete microwave systems have not been fabricated as a monolithic unit.

SUMMARY OF THE INVENTION

Realizing the inherent disadvantages and shortcomings of the previously utilized "bolt together" technology for the fabrication of millimeter and sub-millimeter wave length microwave systems, it is the primary objective of the present invention to provide a non-optical microwave system incorporating all of the system components including active and/or passive RF components, a microprocessor controller, and digital control circuits into a single monolithic substrate to provide a monolithic phased array antenna system for use at X-band frequencies and above.

A further objective of the present invention is to provide a fabrication process for monolithic microwave integrated antennas suitable for high volume, low cost production that is also repeatable and reliable.

The monolithic microwave integrated antenna system and the method of fabrication described herein enable the physical integration of active microwave and digital circuits onto a common substrate. The fabrication technique provided by this invention is not unique to a particular microwave system design but rather is applicable to a wide range of systems and system frequencies, i.e., 10 GHz through $10^8$ GHz (ultraviolet). The fabrication technique set forth herein is based upon thin-film techniques. The fabrication of all components whether active or passive and their interconnections are formed by either semiconductor or thin-film processing steps.

Using the fabrication technique set forth herein, design changes can be implemented through mask and/or material and process variations rather than through the previously required intricate hardware modifications.

The monolithic nature of the microwave system has the inherent benefits of low volume (non-bulky), light weight, and high reliability. The fabrication process lends itself to automated, high volume production so that even the most complex designs will be repeatable and cost effective when compared with present fabrication and assembly techniques. The inherent accuracy and precision of the process enables component size and separation to be scaled with frequency thereby eliminating or reducing parasitic reactances for improved performance. The inherent repeatability will eliminate the need for "tweaking" or circuit adjustment to meet performance specifications.

In essence, the systems and fabrication techniques set forth herein represent a unique marriage of the arts of semiconductor and integrated circuit fabrication techniques, used at frequencies lower than microwave, with integrated monolithic electromagnetic system techniques.

The invention recognizes and builds upon the commonality of materials and processes associated with digital and linear integrated circuits, active and passive microwave semiconductor devices, microwave integrated circuits and monolithic antenna systems. The present invention also recognizes that it is both technically advantageous and unique to integrate these devices into a functional monolithic system.

The fabrication technique features the use of ion implantation directly into high quality semi-insulating GaAs to form the active layer for planar FET elements.

BRIEF DESCRIPTION OF THE DRAWINGS

The invention will now be described in further detail with reference to the accompanying drawings wherein:

FIG. 3 is a schematic diagram of a monolithic microwave integrated circuit adapted to receive visible light and deliver dc power;

FIG. 4 is a graphical representation of the E-plane half power beamwidth of a sapphire element radiator, plotted from experimental results;

DETAILED DESCRIPTION OF THE PREFERRED EMBODIMENTS

Figure 1:
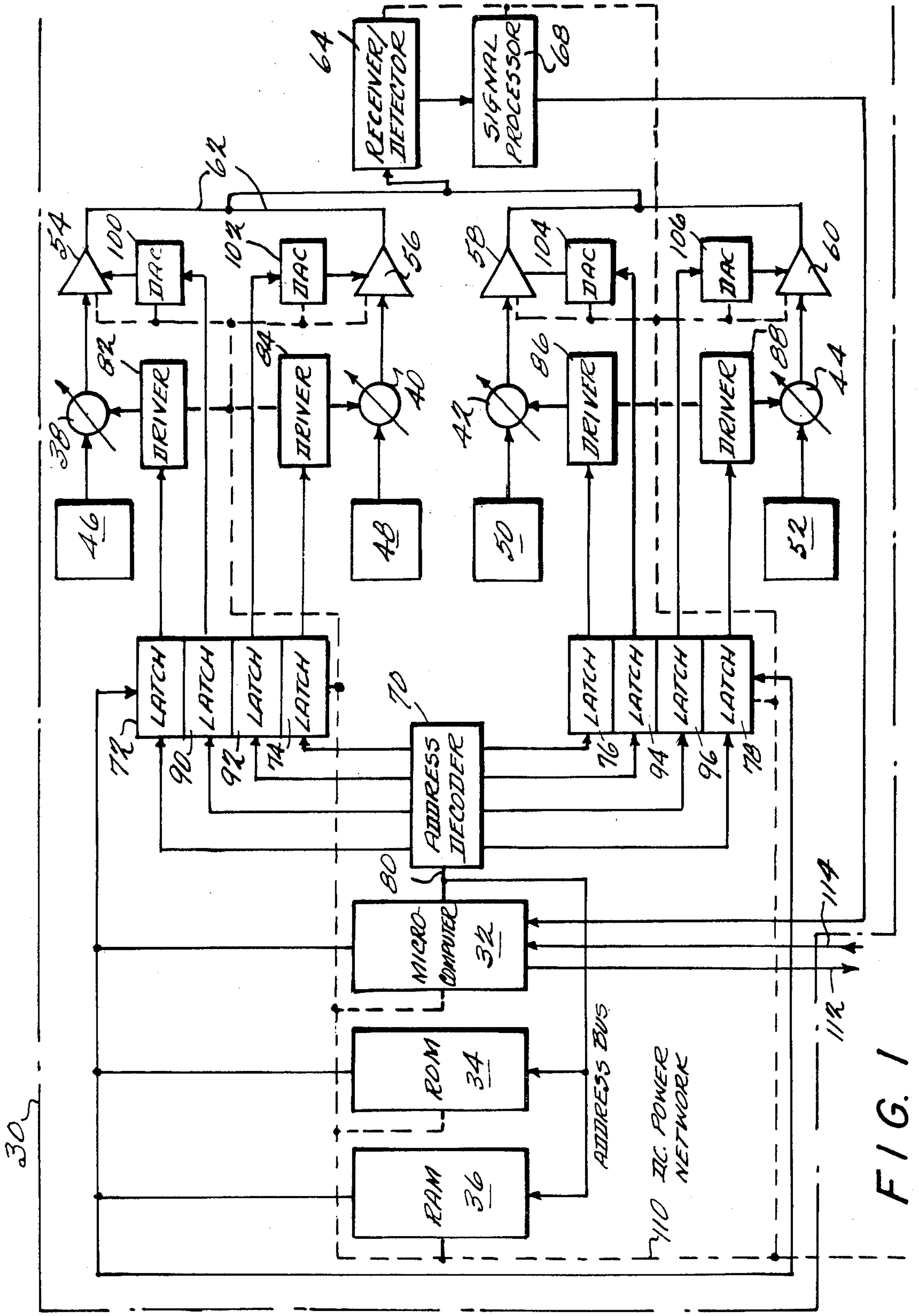
FIG. 1 is a block diagram of a monolithic microwave integrated circuit receiver according to the present invention.

Referring now to FIG. 1, there is shown a block diagram of a first embodiment of the monolithic microwave integrated circuit according to the present invention. The embodiment shown in FIG. 1 is a four (4)-element microcomputer controlled phased array. The phased array shown in FIG. 1 is configured as a receiving array. The corresponding transmitting array is shown in a second embodiment in FIG. 2. Continuing to refer to FIG. 1, all components are integrated onto a common substrate 30. The phased array is controlled by a microcomputer 32 operating in accordance with a program stored within a read only memory (ROM) 34. The program stored in ROM 34 defines the beam pattern to be followed by the phased array. A random access memory (RAM) 36 provides volatile memory for microcomputer calculations during the execution of its program. For a desired scanning pattern, microcomputer 32, based upon the program of ROM 34 computes the phase setting appropriate for each of four (4) phase shifter elements 38, 40, 42 and 44. These phase shifter elements control the phase shift of the four (4) array elements 46, 48, 50, and 52, respectively.

As previously stated, FIG. 1 is a receiver configuration. Signals from array elements 46, 48, 50, and 52, coupled through their respective phase shifters are amplified by low noise amplifiers 54, 56, 58, and 60, associated respectively therewith. The outputs of amplifiers 54, 56, 58 and 60 are combined by a corporate feed 62 and are coupled to a receiver or detector 64. Output base band signals from receiver or detector 64 are coupled to a signal processor 68 controlled by microcomputer 32.

Microcomputer 32 controls phase shifters 38, 40, 42 and 44 via an address decoder 70 and latches 72, 74, 76, and 78 associated one each with the phase shifters. Data from microcomputer 32 appears in serial fashion on an address bus 80 coupled to address decoder 70. The serial data is latched into latches 72, 74, 76 and 78 and then is transferred to an associated driver 82, 84, 86 and 88 on a single clock pulse. Thus, the phase of each of phase shifters 38, 40, 42 and 44 is shifted simultaneously.

Similarly, the individual gains of low noise amplifiers 54, 56, 58 and 60 are controlled by microcomputer 32 via address decoder 70, latches 90, 92, 94, and 96 and individual digital to analog converters 100, 102, 104 and 106, associated one each with the low noise amplifiers. Serial data from microcomputer 32 is decoded by address decoder 70. Latches 90, 92, 94 and 96 latch the serial information in place and on a single clock pulse the information latched is transferred simultaneously from all latches to the digital to analog converters. Thus, the gains of the low noise amplifiers are changed simultaneously. A DC power network 110 shown in dotted line, distributes power to all active circuit elements. A data output line 112 provides a means for connection to an external sensor or to another microcomputer. A command input line 114 provides an input from an external source such as an operator or another microcomputer. Array elements 46, 48, 50 and 52 are of the general type known in the art, even though not previously fabricated as part of a totally integrated microwave system. Specific examples of array elements 46, 48, 50 and 52 are detailed in U.S. Pat. No. 3,811,128 entitled "Electronically Scanned Microstrip Antenna" and U.S. Pat. No. 3,921,177 entitled "Microstrip Antenna Structures and Arrays", commonly owned with the present patent. These two patents are incorporated herein by reference to avoid unnecessary lengthy discussion.

Figure 2:
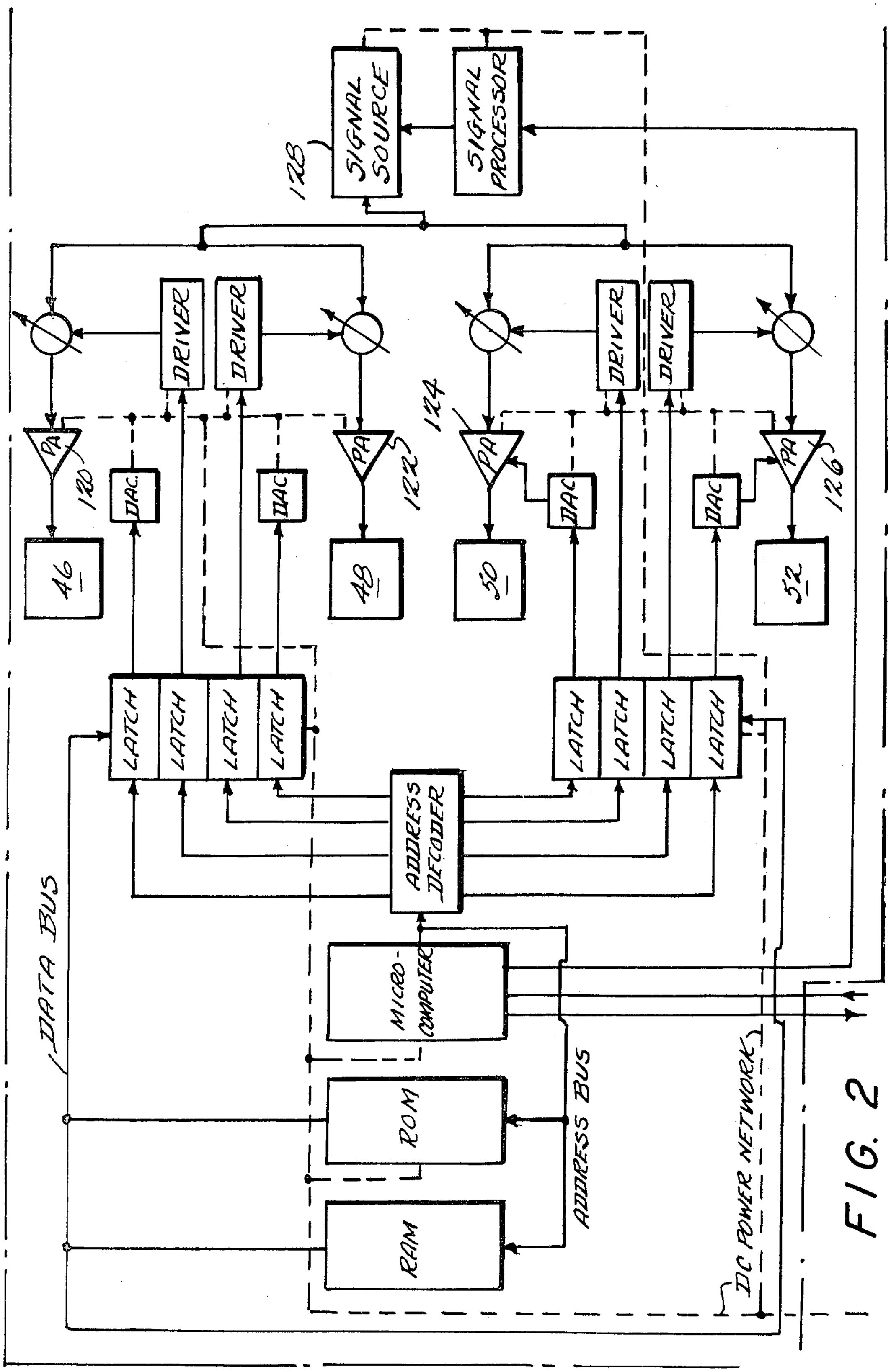
FIG. 2 is a block diagram of a monolithic microwave integrated circuit transmitter according to the present invention.

Referring now to FIG. 2 there is shown a second embodiment of the monolithic microwave integrated circuit according to the present invention. As previously stated, this figure is a block diagram of a transmitting array corresponding to the receiving array shown in FIG. 1. In essence, the transmitting array is configured by exchanging the locations of the phasing networks and amplifiers shown in FIG. 1. In addition, the amplifiers 54, 56, 58 and 60 of FIG. 1 are replaced by voltage controlled power amplifiers 120, 122, 124, and 126; and receiver or detector 64 is replaced by a signal source 128. Otherwise, the remaining elements of FIG. 2 are identical to those of FIG. 1.

Referring now to FIG. 3, there is shown in schematic diagram. a third embodiment of the monolithic microwave integrated circuit according to the present invention. It illustrates a possible application of the underlying concepts of the monolithic microwave integrated circuit to the visible light spectrum of $10^5$–$10^6$ GHz. Receiving array elements 150 would gather visible light, such as solar energy, which would be converted into direct current by diode networks 152. The power from each of diode networks 152 would be "summed" by a DC power collection network 154 and delivered to an output terminal 156. All of the elements are integrated onto a common substrate 160. Ground 158 is a continuous (e.g. the metalized back surface of the substrate). Arrays such as this can be used to form even larger arrays since the gain and hence the collected energy is proportional to $4\pi$ (AREA)/2

SEMICONDUCTOR MEDIUM

The presently preferred embodiments of the monolithic microwave integrated circuit shown in FIGS. 1 and 2 are fabricated on semi-insulating gallium arsenide (S.I. GaAs). However, other media, such as silicon and/or GaAs on sapphire represent potential alternatives. At this time, only silicon and gallium arsenide present practical choices for X-band application because the processing technologies for these media are sufficiently mature so that consistent, repeatable results may be achieved at microwave frequencies. Other Groups III-V semiconductor compounds having better theoretical band gap and carrier mobility characteristics may ultimately be well suited for millimeter and submillimeter applications, but at the present time neither the material nor processing technology for these compounds has been sufficiently developed to provide the uniformity required for mass production. As a result the presently preferred embodiments, set forth herein, utilizes semi-insulating GaAs, with silicon being the only presently viable alternative.

In further consideration of the semiconductor medium, PIN diodes fabricated in planar, mesa and beam-lead configurations have been successfully used as switching elements at X-band microwave frequencies and above for over a decade in "bolt together" systems. These devices are made from the highest quality bulk silicon with cutoff frequencies in excess of 2000 GHz. Silicon, however, has a maximum resistivity of only 200–300 ohm-cm undoped. The loss tangent of silicon is therefore many orders of magnitude worse than that of standard microwave substrate materials such as quartz, alumina and sapphire. Typical microstrip transmission lines on silicon have losses of several dB/cm. Thus, the dielectric losses in a microstrip radiator on bulk silicon would reduce aperture efficiency to 20%, which is impractical.

The use of a silicon on sapphire (SOS) medium would eliminate this loss problem by allowing the microwave radiator and feedline to be fabricated on the sapphire dielectric leaving silicon only in small areas where PIN diodes need to be fabricated. This would solve one problem but create another. To date the achievable electron mobility, $\mu n$, in SOS epitaxial layers is less than that of bulk silicon. Therefore, PIN diodes suitable for X-band switches are not practical.

Another negative aspect of silicon is that low noise amplifiers are impractical at X-band. This is significant because the ultimate benefits of monolithic microwave integrated circuits and antennas could not be realized in silicon at this frequency.

MICROSTRIP RADIATORS

Microstrip radiators 46, 48, 50 and 52 are fabricated as a metallization adjacent to the semiconductor material. Layers of Ti-Pt-Au are deposited sequentially on the semiconductor material. The final metalization layer of Au should be at least four (4) skin depths thick at the operating frequency to prevent excessive ohmic losses in the microwave conductors.

In conventional microstrip radiator designs such as illustrated by U.S. Pat. No. 3,811,128 entitled "Electrical Scanned Microstrip Antenna" and U.S. Pat. No. 3,921,177 entitled "Microstrip Antenna Structures and Array", the choice of a dielectric or substrate material is based on tradeoffs involving physcial size and efficiency. As an example conventional hybrid microwave integrated circuits are often configured on high dielectric constant substrates with small conductors in order to minimize physical size. Circuit losses in the "bolt together" systems are often not critical since amplification stages can be liberally incorporated. Conversely, microstrip antennas, phasing networks and corporate feed networks are typically restricted to utilizing low dielectric constant materials such as teflon-fiberglass and employ larger conductors to achieve minimum loss, hence maximum gain.

In the presently described monolithic microwave integrated circuit, however, these traditional tradeoffs are overshadowed by totally different requirements imposed by the semiconductor device. Since the performance of a semiconductor component is uniquely related to the physical properties of the material, radiators 46, 48, 50 and 52 are adapted to the semiconductor medium without compromising element performance, i.e., radiation efficiency.

This adaptation is important because high efficiency, typically 90–95%, is an inherent "no-cost" characteristic of microstrip radiators. If this efficiency is inadvertently sacrificed, an amplifying component with its attendant increase in dc power will be required to recover the lost aperture gain. Such a trade-off is not at all attractive and therefore has been avoided.

Alternative microstrip radiators using quartz, alumina and sapphire substrates were tested as alternatives for the fabrication of radiators 46, 48, 50 and 52. Optimum performance was obtained for sapphire elements. The E-plane half-power beamwidth of the sapphire radiator was 126 degrees, as shown in FIG. 4, which is a computer plot of experimentally measured data. This half power beamwidth is desirable for phased array applications since the element factor does not degrade severly at large scan angles. Such broad beamwidths are characteristic of microstrip elements on high dielectric constant materials, and are explained by the examples shown in FIGS. 5 and 6.

Figure 5:
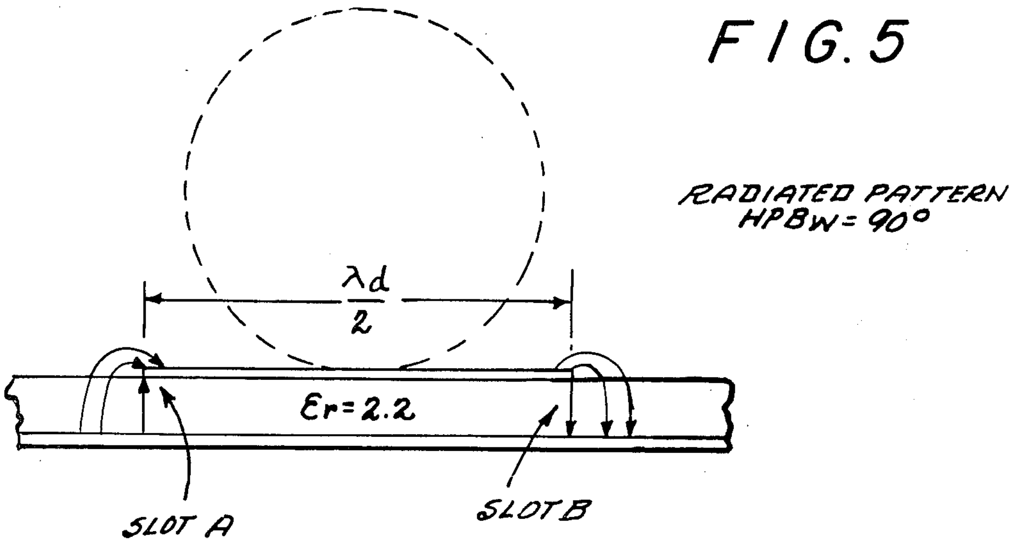
FIG. 5 is a cut-away side view of a microstrip radiator element showing a 90° E-plane half power beamwidth.
Figure 6:
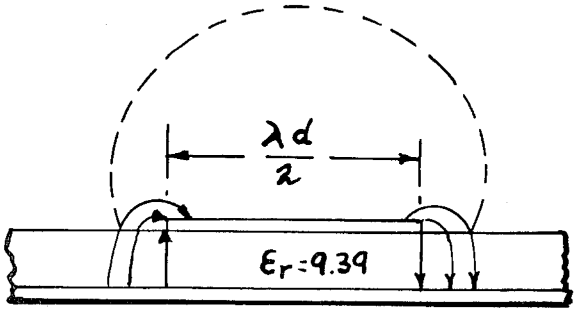
FIG. 6 is a cut-away side view of a microstrip radiator element showing a 126° E-plane half power bandwidth.

Referring now to FIGS. 5 and 6, there are shown cut-away side views of microstrip radiators showing half power beamwidths of 90° and 126°, respectively. In essence the microstrip element is a two slot radiator and the dielectric under the patch can be treated as a low impedance transmission line $\lambda/2$ long connecting slot A and slot B. The half-wavelength property of this transmission line is determined by the dielectric constant of the material, however, the radiated field is a function of the slot separation in terms of free-space wavelength. A typical element on teflon-fiberglass dielectric, $r=2.2$, is shown in FIG. 5 and has a half power beamwidth of 90°. A comparable element on sapphire, $r=9.39$ is shown in FIG. 6. The resonant dimension or slot separation is reduced due to the higher dielectric constant resulting in a smaller aperture, hence broader beamwidth. It is also significant to note that the aperture efficiency of the same sapphire element. determined by integration of the far-field radiation patterns is in excess of 93%.

The sapphire element has a 2:1 VSWR bandwidth of 9.5% which is substantially greater than the typical 1–3% bandwidths associated with designs on lower dielectric materials.

Similar performance is obtained on slightly higher dielectric constant materials such as the semi-insulating (S.I.) GaAs with r–12.6 utilized in the preferred embodiment. Efficiency is slightly degraded since the loss tangent of S.I. GaAs having a resistivity of $10^8$ ohm-cm is equivalent to that of 99.6% $AL_2O_3$ or Alumina. The loss tangents for sapphire (mono-crystalline $AL_2O_3$) and S.I. GaAs or Alumina are $2\times10^{-5}$ and $1\times10^{-4}$ respectively. Although these values are nearly an order of magnitude apart, the additional loss due to increased dielectric dissipation is negligible since the term is only 1.5% of the conductor loss. The net result, then, is that microstrip radiator aperture efficiencies on GaAs exceed 90%.

PHASE SHIFTER SWITCHING ELEMENTS

Figure 7:
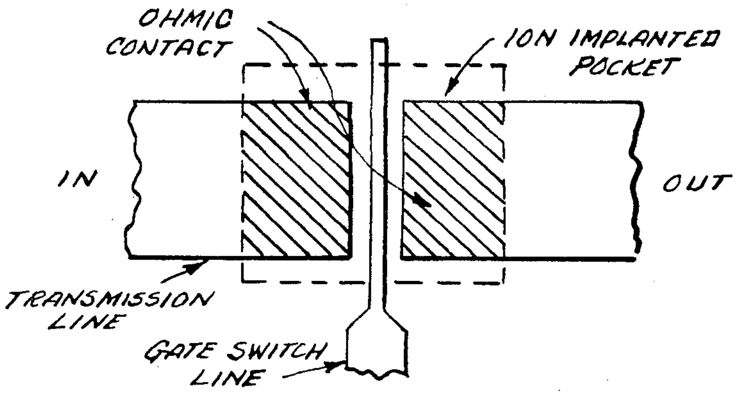
FIG. 7 illustrates the physical structure of a single gate FET switch used in the phase shifter elements.
Figure 8:
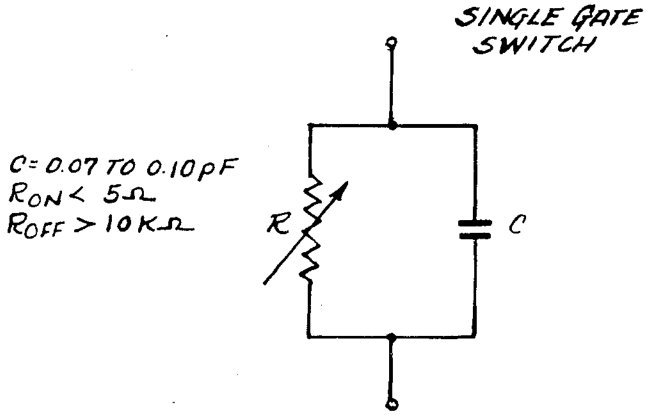
FIG. 8 is a schematic diagram of the equivalent circuit of the single gate FET switch shown in FIG. 7.

Referring now to FIGS. 7 and 8, there are shown respectively the physical structure and equivalent circuit of one of the single gate FET switches that are utilized as the switching elements of 4-bit phase shifters 38, 40, 42 and 44. FET switches provide low power consumption and are fabricated using ion implantation planar GaAs technology.

The single gate FET switch, as shown in FIG. 7, is turned on and off by application of the appropriate voltage to the gate electrode. The on state is achieved with the gate zero biased or slightly forward biased with respect to the switch terminals. The off state is achieved by biasing the gate beyond the channel pinch-off voltage (negative for the usual n-type depletion-mode GaAs FET). There is no bias applied to the switch terminals for the FET switch.

As a result, there is no distinction between source and drain electrodes in the conventional sense. Also, as in the case of the varactor switch alternative, there is no required sustaining power to hold the FET switch in either the on or the off state. The use of a three terminal (or 4-terminal in the case of the dual gate FET) device for switching greatly simplifies the application of switching bias since the need for dc blocking capacitors is eliminated.

In the on state, the single gate FET switch exhibits a small resistance which is the sum of the channel resistance plus the ohmic contact resistance of the switch terminals. For a 500 $\mu$m wide FET with $n^+$ implanted ohmic contacts and a pinch off voltage of about 7 volts, the on resistance can be reduced to about 5Ω or less for a single gate switch and about 7Ω or less for a dual gate switch. Lower on state resistance can be achieved by increasing the width of the switch for a corresponding decrease in resistance but with a resultant increase in shunt capacitance in the off state. The dual gate switch has additional resistance due to the additional channel length required for the second gate. The parasitic series inductance in the on state can be made negligible by integrating the switch into the transmission line. It may be desirable in some applications to intentionally introduce inductance by locating the switch in a section of transmission line away from the ground plane.

The current handling capability of the FET switch in the on state is limited by the drain saturation current which is of the order of 150 mA for the 500 $\mu$m wide FET considered earlier assuming zero gate bias. Therefore, if the FET switch is used to effectively short circuit a 50Ω transmission line, the power handling capability in the on mode is about 63 to 100 mW. This power handling capability is more than adequate for switching in a low power phase shifter.

In the off state, the FET switch is essentially non-conductive and the microwave impedance is dominated by the shunt capacitance across the switch terminals which is largely the fringing field capacitance through the semi-insulating GaAs substrate of the gap capacitor formed when the gate is completely pinched off. For a 500 $\mu$m wide switching FET, this shunt capacitance is of the order of 0.07 to 0.1 pF. At 10 GHz the capacitance of the off switch is about 160Ω to 230Ω. Since the off resistance of the FET switch is very high, the dissipation is very small in this state, i.e. reflection coefficients with magnitude near one are obtained. Thus, some form of ballasting or loading may be required to balance the amplitude characteristics between the two switching states. The power handling capability of the switch in the off state is determined by the amplitude of the rf voltage swing which can be sustained across the switch without turning the FET on in one direction or the other. For a single gate switch, the FET will turn on if the bias between the gate and either switch terminal (ohmic contact) becomes less than the pinch off voltage. Thus, the maximum permissible voltage swing across the switch cannot exceed the excess gate bias beyond pinch off. For example, if the pinch off voltage is −7 V and the gate is biased at −10 V, the rf swing at the output of a single gate switch may not exceed 3 V peak or 6 V peak-to-peak or else the FET will turn on during negative excursions of the rf voltage. In this example, the power handling capability of the off single gate switch would be about 23 mW into a 50 line which is again entirely adequate for a low-power phase shifter.

The single FET switch utilized in the preferred embodiment has the advantages of ease of biasing, power handling capability, and compatibility with existing process technology. There is, in addition, another subtle advantage for the FET switch in terms of control of circuit parameters. The circuit parameters of the FET switch are almost completely defined by the geometry which is established by the photolithography process. For the varactor switch, however, the capacitance in the on and off states is determined by the doping profile, bias voltage, and junction area. Although excellent control is anticipated over doping profiles through the use of ion implantation processes, the FET switch would be expected to hold an advantage in tightness of parameter distributions which would result in superior circuit reproducibility.

PHASE SHIFTER CIRCUIT

The realization of a 4-bit shifter involves incorporation of the switching elements (FET switches in the preferred embodiment) into circuitry permitting the insertion phase of the phase shifter to be switched in binary increments (22.5°, 45°, 90° and 180°) while maintaining nearly constant input and output VSWR and amplitude uniformity independent of phase.

Figure 9:
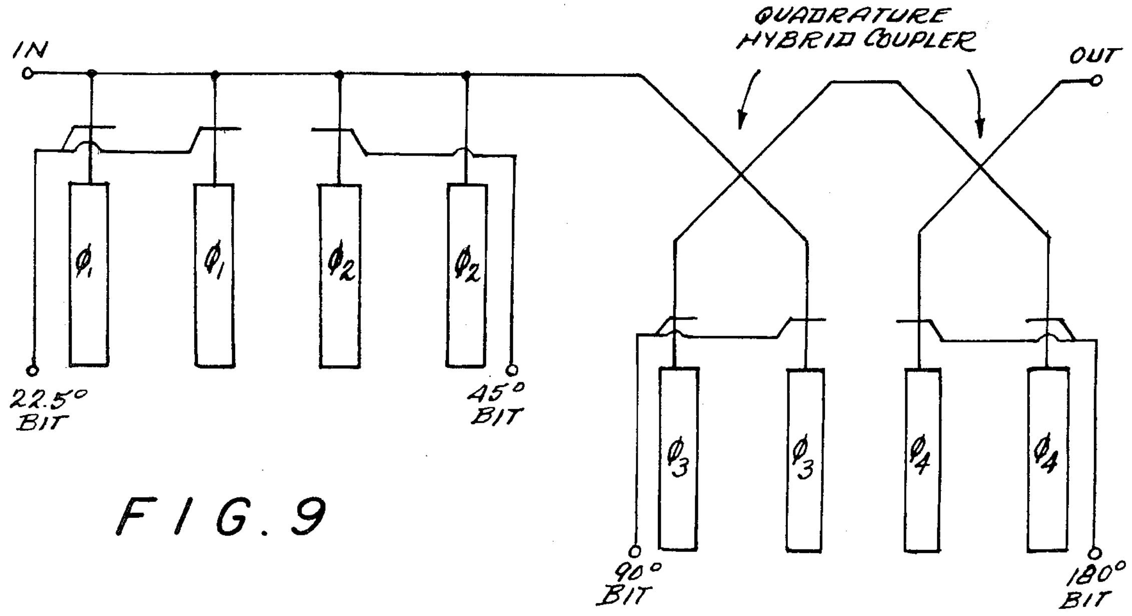
FIG. 9 is a schematic diagram of the preferred embodiment of one of the 4-bit phase shifters utilizing a hybrid design.

Referring now to FIG. 9, there is shown a schematic diagram of one of the four-bit phase shifters 38–44. The phase shifters utilize FET switching elements, as previously discussed, in a circuit using both switched line and hybrid coupled techniques. The 45° and 22.5° bits use a switched line configuration to reduce area while the 90° and 180° bits utilize a hybrid configuration.

There are alternative phase shifter circuits which may be appropriate to alternative embodiments. The following discussion relates in general to these various alternatives and to the guiding criteria that will aid in the design of other phase shifter circuits.

Figure 10:
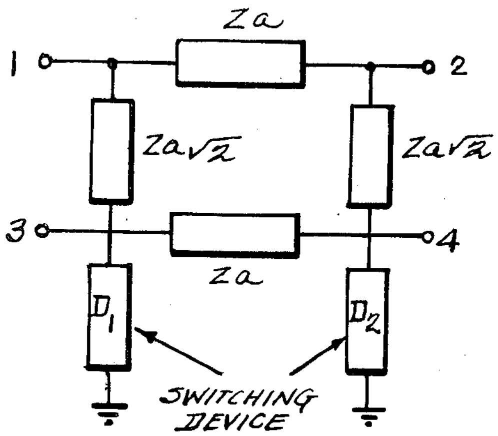
FIG. 10 is a physical schematic of a branch line hybrid coupler.

Referring now to FIG. 10, there is shown, as another example, a physical schematic of a quadrature hyrid coupler in a branch line configuration. The branch line coupler is limited in bandwidth to about 10 to 15 percent since the transmission match, 3 dB power split, and 90° phase shift is only realized for the frequency at which all line lengths are 90 °.

Figure 11:
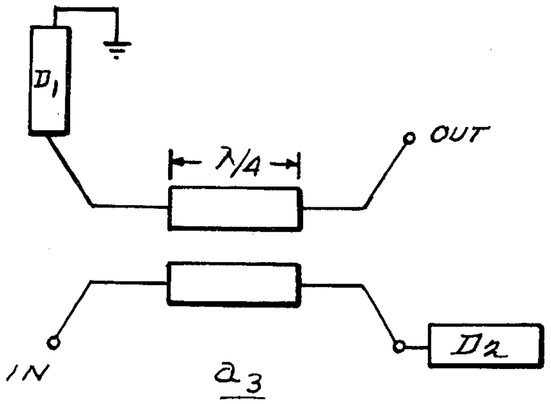
FIG. 11 is a backward wave quadrature hybrid coupler.

The backward wave interdigitated coupler, shown in FIG. 11, gives the broadest phase-shifter bandwidth of all and can be made fairly compact in size. This arises from the fact that although the 3 dB power split is realized only at the center frequency, the 90° phase difference between the coupler output arms, the input match, and the directivity are theoretically frequency independent. Another advantage is that the device is comparatively small and can also be fabricated in a single plane. This coupler typically yields octave bandwidths when designed in stripline, but due to unequal even and odd mode phase velocities in microstrip line the bandwidth reduces to about 35 to 40 percent. Such bandwidth is more than adequate for element compatibility.

Figure 12:
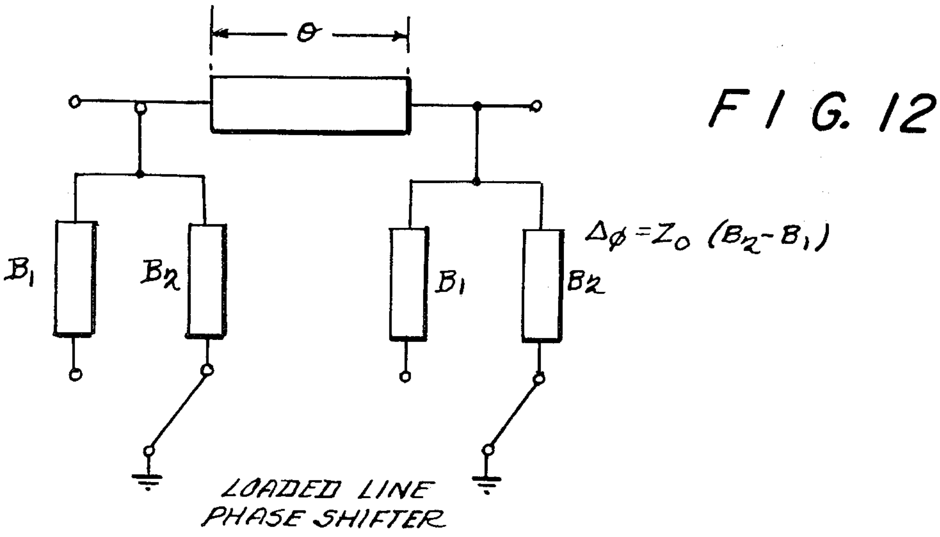
FIG. 12 is a schematic diagram of a loaded line phase shifter.

A configuration suitable for the 45° and 22.5° bits is shown in FIG. 12. The loaded-line phase shifter is particularly worth considering with regard to their potential for small size. The loaded line phase shifter offers good VSWR and constant phase shift up to 20 percent bandwidith, but is practically limited to 45° maximum shift for that bandwidth. The design of the loaded-line phase shifter is based upon two factors. First, a symmetric pair of quarter wavelength spaced shunt susceptances (or series reactances) will have mutually cancelling reflections provided their normalized susceptances are small. Therefore, a good match results regardless of the susceptance sign or value.

FABRICATION

The fabrication process begins with the lapping and polishing of the semi-insulating GaAs substrate to a plane parallel thickness compatible with microstrip propagation characteristics (typically 0.6 mm at 10 GHz). Several surface cleaning steps insure proper adhesion of deposited $SiO_2$ and metal layers required for masking during the ensuing ion-implantation. The process continues following the sequence depicted in FIG. 13.

Figure 13:
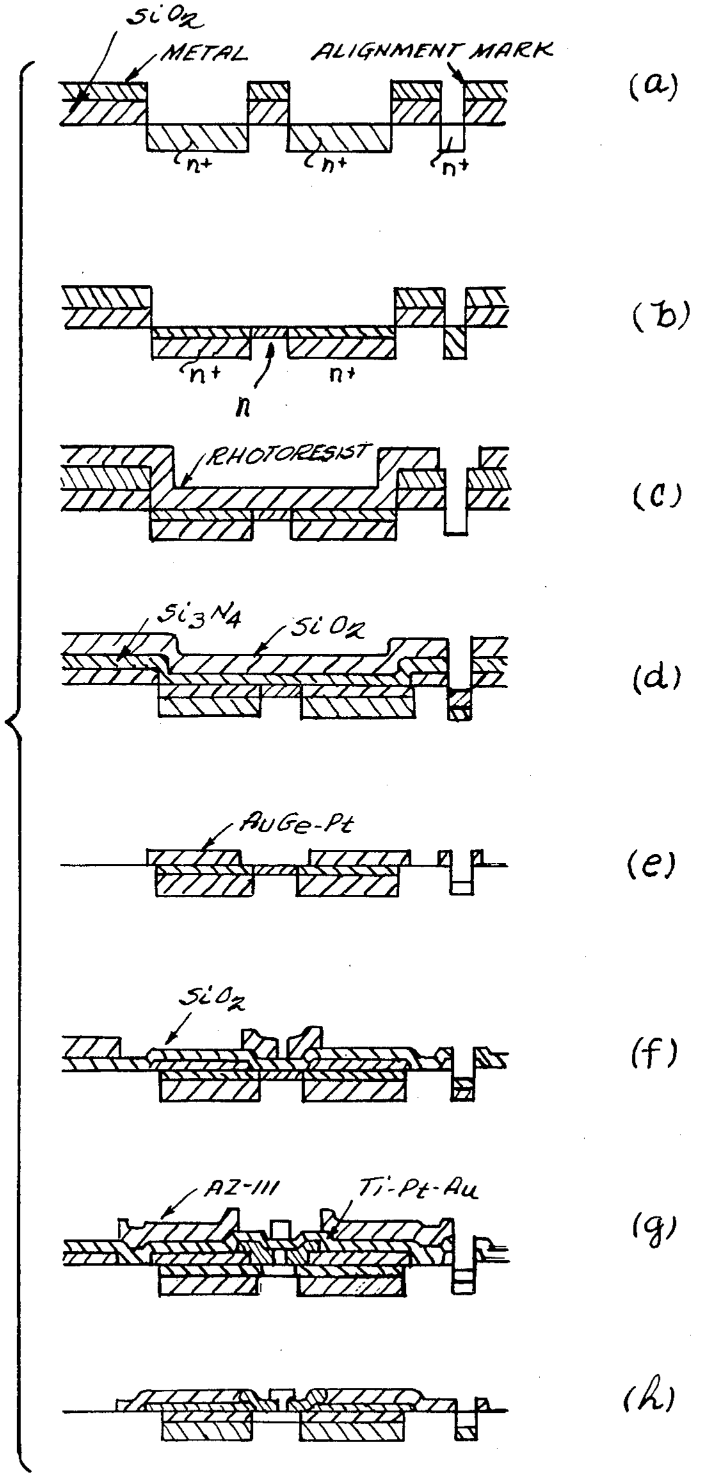
FIG. 13 depicts the fabrication process for the planar GaAs FET phase shifter elements.

Referring now to FIG. 13, there are shown the processing steps for fabricating one of the planar GaAs FET phase shifter elements. As shown in FIG. 13(*a*) the semi-insulating substrate is covered with $SiO_2$ and a suitable metal. Holes are opened and the $SiO_2$ is removed by dry etching. The N+ implant is then performed. After the N+ implant is performed, the metal and oxide mask is removed from the source in FIG. 13(*b*). Then the alignment mark is defined by ion milling, as shown in FIG. 13(*c*). After the alignment mark is defined, the resist and metal are removed. Nitride and oxide is deposited and the implantation anneal is performed, as shown in FIG. 13(*d*). After the implantation anneal is performed, the insulators are removed and ohmic contact holes are defined using conventional photolithographic techniques. AuGe-Pt is then deposited. FIG. 13(*e*) shows the device after AuGe-Pt has been deposited. As shown in FIG. 13(*f*), a layer of $SiO_2$ is deposited. The gate and ohmic contact holes are defined and the exposed $SiO_2$ is removed by plasma etching, after removal of the $SiO_2$ by plasma etching, Ti-Pt-Au is deposited and the gate and circuit path areas are defined using conventional photo resist technology, as shown in FIG. 13(*g*). Then the exposed metal is removed by ion-milling, as shown in FIG. 13(*h*).

In the processing step shown in FIG. 13(*h*), the microstrip transmission lines, radiating element and DC biasing interconnect metallization are formed using photolithographic procedures. At this point RF blocking chokes or eventually lumped element components are simultaneously defined.

The use of ion implantation directly into high quality semi-insulating GaAs to form the active layer for planar FETs places certain restrictions on the nature of the compensation method used to obtain the insulating properties. The following conditions must be met to allow to achieve successful implantation of an active layer:

1. The compensating impurities and defects in the substrate must not affect the electrical properties of the ion implanted layer, so that carrier concentration, mobility, carrier lifetimes, etc., depend only on the identity and dose of the implanted purity. Meeting this condition ensures that the electrical properties of the implanted layers are independent of the substrate, and guarantees that the implanted layers can be prepared reproducibly.

2. Unimplanted portions of the semi-insulating substrate must retain their high resistivity after a wafer has been capped and annealed to remove damage in the implanted portions, so that electrical isolation is maintained between the doped pockets.

3. The substrate must be homogeneous. This implies that conditions 1 and 2 must be met with a minimum of short or long-range inhomogeneities or defects. In addition to homogeneity, flatness requirements on the wafers will be stringent for uniform small geometries and high density.

As previously stated the semiconductor material is semi-insulated GaAs, chromium (Cr) compensated (doped) grown by the horizontal Bridgman technique. The crystalline quality of the horizontal Bridgman grown ingots are superior with regard to low percipitate density, dislocation density and strain. Electrical compensation is routinely obtained with low Cr concentrations of $5\times10^{15}$ cm$^{-3}$. The initial uncompensated background doping is often as low as $8\times10^{14}$ cm$-$3.

In order to obtain a high level of reproducibility, the GaAs may be qualified by a procedure such as that set forth in U.S. Pat. No. 4,157,494—Eisen et al (1979).

Thus, there has been provided a monolithic microwave system including an integral array antenna. Of course, various alternative embodiments will be apparent to those of ordinary skill in the art having the benefit of the teachings set forth herein. Therefore, such alternate embodiments are intended to be within the scope of the appended claims.

We claim:

1. A method for fabricating planar phase shifter for a monolithic microwave system comprising the steps of:

lapping and polishing a layer of semi-insulating GaAs to a plane parallel thickness compatible with microstrip propagation, said layer serving as a substrate for said monolithic microwave system;
covering the substrate with $SiO_2$ and a metal;
opening windows in said metal;
removing the $SiO_2$, exposed through said windows by dry etching;
ion implanting to form N+ regions;
removing the remaining metal and $SiO_2$ from a source to drain gap region;
ion implanting an active layer;
defining an alignment mark by ion milling;
removing any remaining metal and photo-resist material;
depositing a nitride and an oxide;
annealing the implantations;
removing the insulators;
defining ohmic contact holes using a photolithographic technique;
depositing metallizations of AuGe-Pt;
depositing a layer of $SiO_2$;
defining gate and ohmic contact holes;
removing exposed $SiO_2$ by plasma etching;
depositing metallizations of TiPtAu;
defining gate and circuit path areas using a photoresist technique; and
removing exposed metal by ion-milling to form microstrip transmission lines, radiating elements and biasing interconnect metallizations.

* * * * *